(12) United States Patent
Sheinwald et al.

(10) Patent No.: US 6,832,264 B1
(45) Date of Patent: Dec. 14, 2004

(54) COMPRESSION IN THE PRESENCE OF SHARED DATA

(75) Inventors: Dafna Sheinwald, Nofit (IL); Michael Factor, Haifa (IL)

(73) Assignee: International Business Machines Corporation, Armonk, NY (US)

(*) Notice: Subject to any disclaimer, the term of this patent is extended or adjusted under 35 U.S.C. 154(b) by 747 days.

(21) Appl. No.: 09/699,958

(22) Filed: Aug. 31, 2000

(51) Int. Cl.$^7$ .............................................. G06F 15/16
(52) U.S. Cl. ....................... 709/247; 709/246; 709/203; 707/101
(58) Field of Search ................................ 709/203, 246, 709/247, 248, 205, 217, 232, 231; 707/101; 341/50, 55; 700/68

(56) References Cited

U.S. PATENT DOCUMENTS

| | | | | |
|---|---|---|---|---|
| 5,721,827 A | * | 2/1998 | Logan et al. | ................ 709/217 |
| 6,243,766 B1 | | 6/2001 | Sliger | |
| 6,279,041 B1 | * | 8/2001 | Baber et al. | ................ 709/232 |
| 6,453,383 B1 | * | 9/2002 | Stoddard et al. | ............ 711/112 |
| 6,466,999 B1 | * | 10/2002 | Sliger et al. | ................... 710/68 |
| 6,546,428 B2 | * | 4/2003 | Baber et al. | ................ 709/232 |

OTHER PUBLICATIONS

"A Universal Algorithm for Sequential Data Compression", J. Ziv and A. Lempel, IEEE Transactions on Information Theory, 23(3), pp. 337–343, May 1977.

"Fixed Data Base Version of the Lempel–Ziv Data Compression Algorithm", A.D. Wyner and J. Ziv, IEEE Transactions on Information Theory, 37(3), pp. 878–880, May 1991.

T. Cover and J. Thomas, Elements of Information Theory, Wiley & Sons, New York, pp. 90–101, 1991.

Chan M.C., et al. "Application of compaction technique to optimizing wireless email transfer", Wireless Communications and Networking Conference, Sep. 21–24, 1999.

Burns, Randall C. "Differential compression: a generalized solution for binary files—Thesis", University of California, (http://www.almaden.ibm.com/cs/storagesystems/delta/rbmsthesis.pdf), Aug. 2002.

Bell, T., et al. "Longest–match string searching for ziv–lempel compression", Software Practice & Experience, John Wiley & Sons Ltd. Chicester, GB vol. 23, No. 7, Jul. 1, 1993, pp. 757–771.

Chan, Mun Choon, et al. "Cache–based compaction: a new technique for optimizing web transfer", INFOCOM '99, Eighteenth Annual Joint Conference of the IEEE Computer and Communications Societies, Proceedings. IEEE New York Mar. 21–25, 1999.

* cited by examiner

*Primary Examiner*—Frantz B. Jean
(74) *Attorney, Agent, or Firm*—Darby & Darby

(57) ABSTRACT

A method for compressing a target string of symbols includes identifying a set of reference strings stored by a computer, and matching a plurality of successive substrings in the target string to respective segments found in one or more of the reference strings. Respective segment specifiers are assigned to the substrings that identify the respective segments to which they are matched, and an ordered list of the specifiers is output.

18 Claims, 5 Drawing Sheets

COMPRESSION IN THE PRESENCE OF SHARED DATA

FIELD OF THE INVENTION

The present invention relates generally to methods and systems for data coding, and specifically to methods of data compression.

BACKGROUND OF THE INVENTION

Compression algorithms based on textual substitution are widely used in storage and transmission of data files. The classic method in this class is the Lempel-Ziv algorithm, described by Ziv and Lempel in "A Universal Algorithm for Sequential Data Compression," published in *IEEE Transactions on Information Theory* 23(3), pages 337–343 (1977), which is incorporated herein by reference. These algorithms are based on finding textual resemblance between different segments in a file. The later occurrence of a given segment is then replaced by a pointer to the earlier occurrence.

Textual substitution algorithms are universally applicable, in the sense that they require no a priori knowledge of the contents of the file. In the asymptotic limit, such algorithms are capable of attaining the best compression possible for a given file. By their nature, however, algorithms known in the art start to gain compression only after an initial portion of the file (sometimes of substantial length) has been processed, and the degree of compression that is achieved grows slowly.

Wyner and Ziv studied the effectiveness of compression using a fixed, predetermined reference string, external to the file that is to be compressed, in a later article, entitled "Fixed Data Base Version of the Lempel-Ziv Data Compression Algorithm," published in *IEEE Transactions on Information Theory* 37(3), pages 878–880 (1991), which is incorporated herein by reference. They showed that asymptotic results similar to those of the classic algorithm can be achieved, provided that the reference string is produced by the same source that generates the file to be compressed. The authors make no suggestion, however, as to how the reference string should be chosen.

SUMMARY OF THE INVENTION

In preferred embodiments of the present invention, a target file is compressed by matching segments in the file to corresponding segments in a reference file or set of files. The present invention exploits the fact that typically, many computers have the same set of common files already resident on their disks, such as help files, program files and other resources supplied by a given vendor or other source. New files supplied from the same source or based on the same set of resources frequently reuse substantial, identical segments of the earlier files. By using these pre-existing, common resources as reference files, it becomes possible to match very long substrings from the target file to appropriate segments in the reference files and thus to achieve compression superior to methods known in the art.

In some preferred embodiments of the present invention, a server compresses a target file to be conveyed to a client based on a common set of reference files shared by the server and the client. The server is typically aware in advance of the reference files held by the client, which typically include the client's operating system files (even if different from the server's operating system) and other software platform components. Alternatively or additionally, the server may derive this information from a preliminary communication with the client. The server codes the target file as a list of specifiers, or pointers, to segments in the client's reference files that match successive substrings in the target file. Each specifier preferably includes a reference file identifier and an offset and length of the segment in the reference file. Substrings in the target file that do not have a match of sufficient length in any of the reference files are preferably added to the pointer list as is, most preferably with a flag to indicate that they are uncoded.

Preferably, the server compresses the coded list by encoding the specifiers in the list. The list of specifiers typically draws on a small subset of the total corpus of reference files. Therefore, the reference file identifiers can be encoded efficiently based on the frequency of their occurrence, using Huffman coding, for example. The server preferably adds a header to the resultant compressed file, identifying the reference files that it has used and their respective codes.

In some preferred embodiments of the present invention, the server maintains multiple sets of reference files, typically corresponding to different client platforms, in order to generate different compressed versions of the target file depending on the client to which the compressed file is to be sent. Alternatively or additionally, the computer prepares and caches the different versions in advance. It will be understood that while preferred embodiments are described herein with reference to a client/server architecture, peer computers may also compress, store and/or transmit to one another efficiently-compressed files based on the principles of the present invention.

In preferred embodiments of the present invention, in order to decompress the file, the client reads the header and opens the appropriate reference files on its own disk. It then processes the list of pointers, retrieving the successive segments from the reference files that are indicated by the specifiers. These segments are concatenated in order to reconstruct the target file, along with any uncoded substrings as appropriate.

Although preferred embodiments are described herein with reference to compression and transmission of files, it will be understood that the principles of the present invention are equally applicable to compression of other bodies of data that can be characterized as strings of characters or other symbols. Therefore, in the context of the present patent application and in the claims, the terms "file," "target file" and "reference files" should be taken to refer generally to substantially any suitable bodies of computer-readable data to which the principles of the present invention may be applied. Similarly, the terms "substrings" and "segments" are used herein for convenience and clarity to denote strings of symbols within the target file and reference files, respectively, and should be understood to refer to strings of substantially any length and suitable type within the bodies of data in question.

There is therefore provided, in accordance with a preferred embodiment of the present invention, a method for compressing a target string of symbols, including:

identifying a set of reference strings stored by a computer;

matching a plurality of successive substrings in the target string to respective segments found in one or more of the reference strings;

assigning respective segment specifiers to the substrings that identify the respective segments to which they are matched; and outputting an ordered list of the specifiers.

Preferably, identifying the set of reference strings includes identifying a set of files used by the computer. Preferably, the files are associated with an operating platform of the computer. Alternatively or additionally, the files include at least one of a program file and a help file.

Preferably, matching the substrings includes, for each of the substrings, finding the respective one of the segments in the reference strings so as to maximize a length of the substring. Further preferably, matching the substrings includes encoding the reference strings in a tree structure having nodes connected by edges corresponding to the symbols in the segments, and finding the respective one of the segments includes traversing in succession the edges of the tree that correspond to the symbols in the substring. Most preferably, traversing the edges of the tree includes traversing the tree up to one of the nodes reached by a last one of the edges in the succession, and assigning the respective segment specifiers includes returning a node specifier associated with the one of the nodes.

Additionally or alternatively, assigning the respective segment specifiers includes assigning the specifiers only to the substrings that are matched by segments of a length no less than a predefined minimum, and including adding to the ordered list of the specifiers the substrings that are matched only by segments that are less than the predefined minimum in length.

Preferably, assigning the respective segment specifiers includes specifying respective identifiers of the reference strings in which the segments occur, wherein assigning the respective segment specifiers includes specifying respective offsets and lengths of the segments within the reference strings in which they occur. Additionally or alternatively, outputting the ordered list includes compressing the list. Preferably, outputting the ordered list includes compressing the identifiers of the reference strings, wherein compressing the identifiers includes coding the identifiers responsive to respective frequencies of occurrence of the identifiers in the ordered list.

Preferably, outputting the ordered list of the codes includes transmitting an output file containing the list to the computer over a communication link.

In a preferred embodiment, identifying the set of reference strings includes identifying first and second sets of reference strings, and matching the plurality of substrings and assigning the segment specifiers includes associating first and second pluralities of the substrings with respective matching segments in the first and second sets of reference strings, respectively, and assigning first and second sets of the specifiers accordingly, and outputting the ordered list includes outputting first and second lists of the specifiers in the first and second sets, respectively, corresponding to the first and second sets of the reference strings.

Preferably, the first and second sets of the reference strings are respectively stored by first and second computers, and outputting the first and second lists includes sending the first list to the first computer, and the second list to the second computer.

There is also provided, in accordance with a preferred embodiment of the present invention, a method for data communications, including:
  identifying at a sending computer at least one reference file that is stored by a receiving computer;
  matching one or more substrings in a target file to respective segments of the at least one reference file;
  compressing the target file by replacing the one or more substrings with segment specifiers that identify the respective segments; and
  transmitting the compressed file from the sending computer to the receiving computer, whereby the receiving computer decompresses the file using the at least one reference file.

In a preferred embodiment, the at least one reference file is associated with a program run by the receiving computer but not by the sending computer.

In another preferred embodiment, identifying the at least one reference file includes receiving the identification of the at least one reference file from the receiving computer via a communication link, and transmitting the compressed file includes choosing the compressed file to transmit responsive to the received identification.

Preferably, identifying the at least one reference file includes recalling a copy of the at least one reference file stored by the sending computer, and matching the one or more substrings includes finding segments that match the substrings at the sending computer using the recalled copy of the at least one reference file.

In a preferred embodiment, identifying the at least one reference file includes identifying first and second reference files stored respectively by first and second receiving computers, and matching and replacing the one or more substrings includes associating first and second pluralities of the substrings with respective matching segments in the first and second reference files, respectively, and replacing the substrings with first and second sets of the specifiers accordingly to generate first and second compressed files, and transmitting the compressed file includes transmitting the first compressed file to the first receiving computer, and the second compressed file to the second receiving computer. Preferably, compressing the target file includes storing the first and second compressed files at the sending computer, and transmitting the first and second compressed files includes recalling the stored, compressed files for transmission thereof.

In another preferred embodiment, the target file includes a first target file, and compressing the target file includes compressing the first target file and inserting an identification of the reference file in a header of the compressed file, and the method includes compressing a second target file by replacing substrings of the second target file with internal pointers to earlier occurrences of the substrings in the second target file, wherein the header of the compressed file includes a field used to indicate that the second target file was compressed using the internal pointers.

There is additionally provided, in accordance with a preferred embodiment of the present invention, a method for decompressing a compressed file, which contains an ordered list of codes specifying respective segments in one or more reference strings stored by a computer, the segments matching respective substrings in a target file, the method including:
  reading the codes from the list;
  retrieving the segments specified by the codes from the one or more reference strings stored by the computer; and
  concatenating the retrieved segments to reconstruct the target file.

Preferably, the one or more reference strings include files used by the computer. Further preferably, reading the codes includes decoding compressed identifiers of the one or more reference strings. Most preferably, retrieving the segments includes reading, from one of the reference strings specified by one of the codes, a sequence of symbols of a length and at an offset within the string specified by the one of the codes. Alternatively or additionally, the compressed file further contains an uncoded substring of characters from the target file, and wherein concatenating the retrieved segments includes concatenating the uncoded substring with the retrieved segments.

There is further provided, in accordance with a preferred embodiment of the present invention, apparatus for compressing a target string of symbols, including a compression processor, adapted to receive an identification of a set of reference strings stored by a computer, to match a plurality of successive substrings in the target string to respective segments found in one or more of the reference strings and to assign respective segment specifiers to the substrings that identify the respective segments to which they are matched, and to output an ordered list of the specifiers.

There is moreover provided, in accordance with a preferred embodiment of the present invention, a server for data communications, including a compressed file processor, which is adapted to receive an identification of at least one reference file that is stored by a receiving computer and to transmit to the receiving computer a compressed file generated by matching one or more substrings in a target file to respective segments of the at least one reference file and by replacing the one or more substrings with segment specifiers that identify the respective segments, whereby the receiving computer decompresses the file using the at least one reference file.

Preferably, the server includes a storage device, which is adapted to store a copy of the at least one reference file, wherein the processor is adapted to recall the at least one reference file from the storage device and to generate the compressed file using the recalled file.

There is furthermore provided, in accordance with a preferred embodiment of the present invention, apparatus for decompressing a compressed file, which contains an ordered list of codes specifying respective segments in one or more reference strings, the segments matching respective substrings in a target file, the apparatus including:

a storage device, adapted to store the one or more reference strings; and a decompression processor, adapted to read the codes from the list, and coupled to retrieve the segments specified by the codes from the one or more reference strings stored by the storage device and to concatenate the retrieved segments so as to reconstruct the target file.

There is also provided, in accordance with a preferred embodiment of the present invention, a computer software product for compressing a target string of symbols, the product including a computer-readable medium in which program instructions are stored, which instructions, when read by a computer, cause the computer to receive an identification of a set of reference strings stored by the computer, to match a plurality of successive substrings in the target string to respective segments found in one or more of the reference strings, to assign respective segment specifiers to the substrings that identify the respective segments to which they are matched, and to output an ordered list of the specifiers.

There is additionally provided, in accordance with a preferred embodiment of the present invention, a computer software product for data communications, the product including a computer-readable medium in which program instructions are stored, which instructions, when read by a sending computer, cause the sending computer to receive an identification of at least one reference file that is stored by a receiving computer, to match one or more substrings in a target file to respective segments of the at least one reference file, to compress the target file by replacing the one or more substrings with segment specifiers that identify the respective segments, and to transmit the compressed file to the receiving computer, whereby the receiving computer decompresses the file using the at least one reference file.

There is further provided, in accordance with a preferred embodiment of the present invention, a computer software product for decompressing a compressed file, which contains an ordered list of codes specifying respective segments in one or more reference strings stored by a computer, the segments matching respective substrings in a target file, the product including a computer-readable medium in which program instructions are stored, which instructions, when read by the computer, cause the computer to read the codes from the list, to retrieve the segments specified by the codes from the one or more reference strings stored by the computer, and to concatenate the retrieved segments to reconstruct the target file.

The present invention will be more fully understood from the following detailed description of the preferred embodiments thereof, taken together with the drawings in which:

DETAILED DESCRIPTION OF PREFERRED EMBODIMENTS

Figure 1:
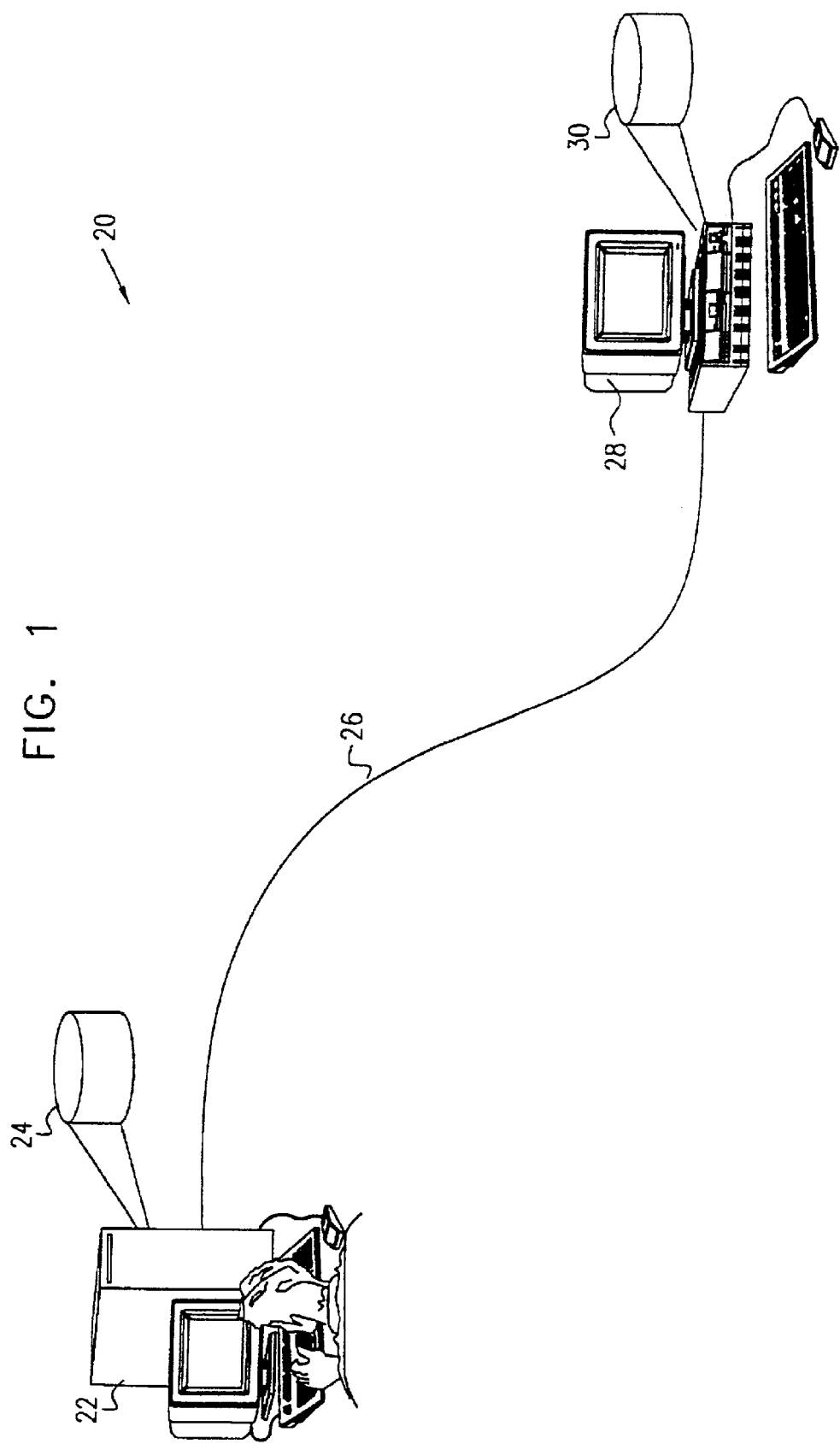
FIG. 1 is a schematic, pictorial illustration of a system for compression, transmission and decompression of files, in accordance with a preferred embodiment of the present invention.

FIG. 1 is a schematic, pictorial illustration of a system 20 for compression, transmission and decompression of a target file, in accordance with a preferred embodiment of the present invention. The target file is compressed by a compression processor 22, typically a server, by drawing on a set of common reference files stored on a disk 24 or other storage medium, as described hereinbelow. The compressed file is preferably transmitted over a communication line 26 to a decompression processor 28, typically a client. Line 26 typically belongs to a local-area network (LAN) or a wide-area network (WAN), such as the Internet. Processor 28 decompresses the file using the set of reference files, which are likewise stored on a disk 30 or other local storage medium accessible to the client. Processors 22 and 28 preferably comprise general-purpose computers, which carry out their functions under the control of software, which may be supplied to them in electronic form, via a network, for example, or may alternatively be furnished on tangible media, such as CD-ROM or non-volatile memory.

Processor 22 compresses a target file for transmission to processor 28, using methods described hereinbelow, based on foreknowledge of the reference files stored on client disk 30. In many modern LAN environments, particularly those in which the clients are managed by one or more servers, the server and client are necessarily aware of at least part of the contents of one another's disks. Even in less tightly-knit environments, such as the Internet, common communication protocols, such as the Hypertext Transfer Protocol (HTTP), begin with an exchange of platform information. This information typically includes an identification of the client's operating system, browser, and/or HTTP daemon, for example. A small number of combinations realistically cover almost all clients. Preferably, the server maintains reference files corresponding to different client configurations and selects the appropriate set of reference files for each given client. Alternatively or additionally, the server caches a compressed version of the target file, and preferably a number of different compressed versions corresponding to different, known client configurations. The client configurations may even be based on a different operating system from that of the server, for example, Windows™ clients served by a Unix server.

Optionally, when the client configuration does not correspond to any one of the set of reference files held by the server, the file is compressed using a conventional Lempel-Ziv type algorithm or other method known in the art. The header of the compressed file transmitted by the server preferably includes a flag that indicates to the client whether or not external reference files are to be used in decompressing the file.

Figure 2:
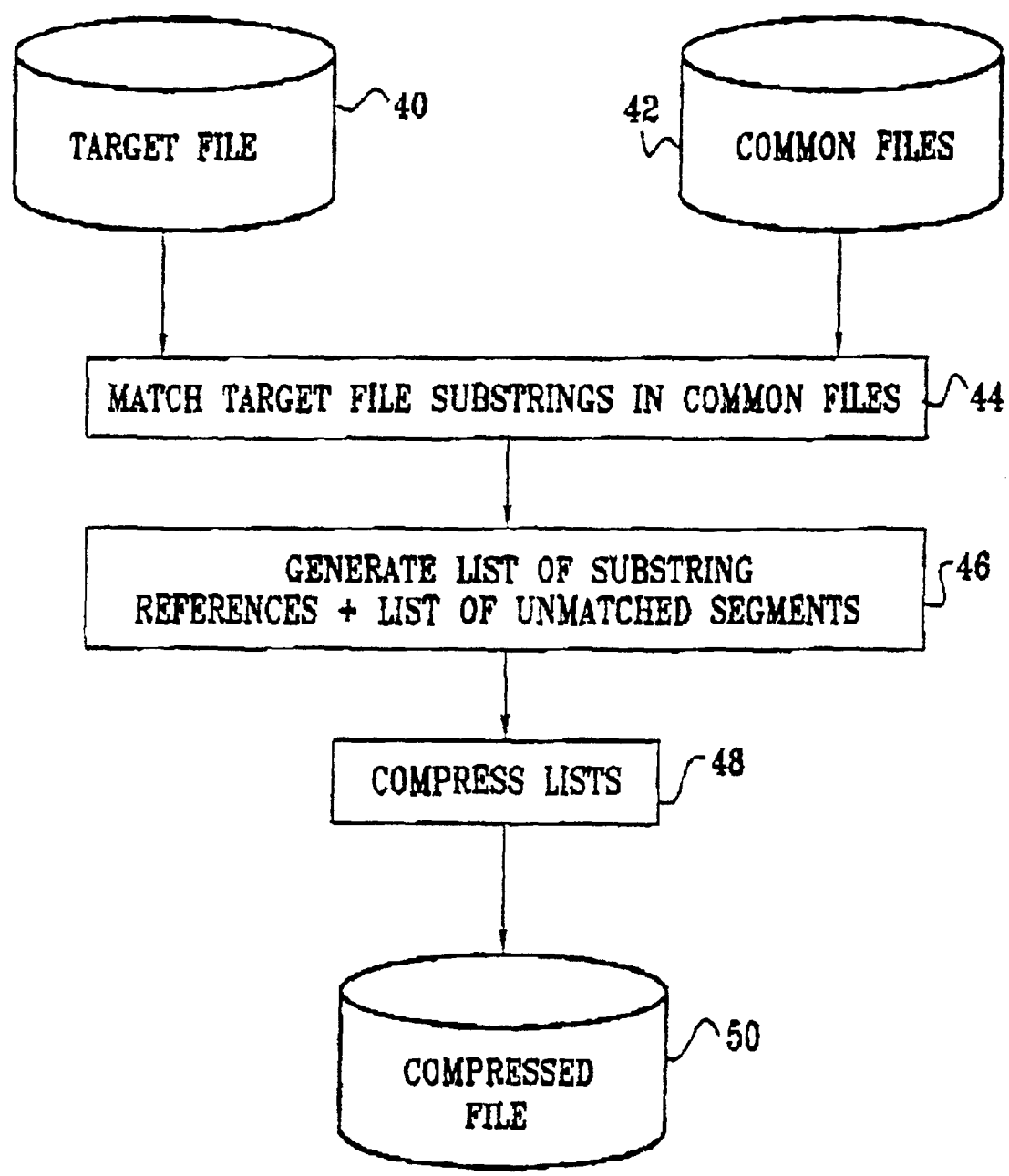
FIG. 2 is a flow chart that schematically illustrates a method for compressing a target file, in accordance with a preferred embodiment of the present invention.

FIG. 2 is a flow chart that schematically illustrates a method for compression of a target file 40 by processor 22, in accordance with a preferred embodiment of the present invention. The compression is carried out with reference to a set of common files 42, which are held by the server and are known to exist on client disk 30. Like other textual substitution algorithms, this method of compression can be time-consuming, and it is therefore preferably carried out by processor 22, or by another computer, in advance of any communication between the server and the client. As mentioned above, the server may prepare and store multiple compressed versions of target file 40, each for a different, common client configuration, and will then select and transmit the version that is appropriate for the client. The method of FIG. 2 is described hereinbelow, without loss of generality, for one such configuration.

At a matching step 44, processor 22 matches substrings in target file 40 to corresponding substrings, or segments, in the set of common files 42 that are known to be shared by the client. This set of common files is also referred to herein as the set of reference files. For effective compression, the processor seeks the longest possible matching segment for each successive substring in the target file, as in textual substitution algorithms known in the art. A preferred method for finding the matching segments is described hereinbelow with reference to FIG. 3.

Each matching segment thus found is preferably specified by a triple of the following form:
<Reference File Identifier, Offset Within the Reference File, Segment Length>
At a list generation step 46, the processor generates an ordered list of such triples, which correspond to the successive substrings of the target file. Preferably, the list also includes short substrings of the target file for which no match of sufficient length was found in the reference files. Attempting to code a very short substring (such as a single word) will typically yield a triple that is longer than the substring itself. Therefore, these unmatched substrings are preferably added to the list without coding.

To generate a compressed file 50 of minimal size, the list of triples from step 46 is preferably itself compressed, at a list compression step 48. A preferred method for compression, based on Huffman coding, is described hereinbelow with reference to FIG. 4. Alternatively, other methods for compressing text files, as are known in the art, may be used at this step.

Figure 3:
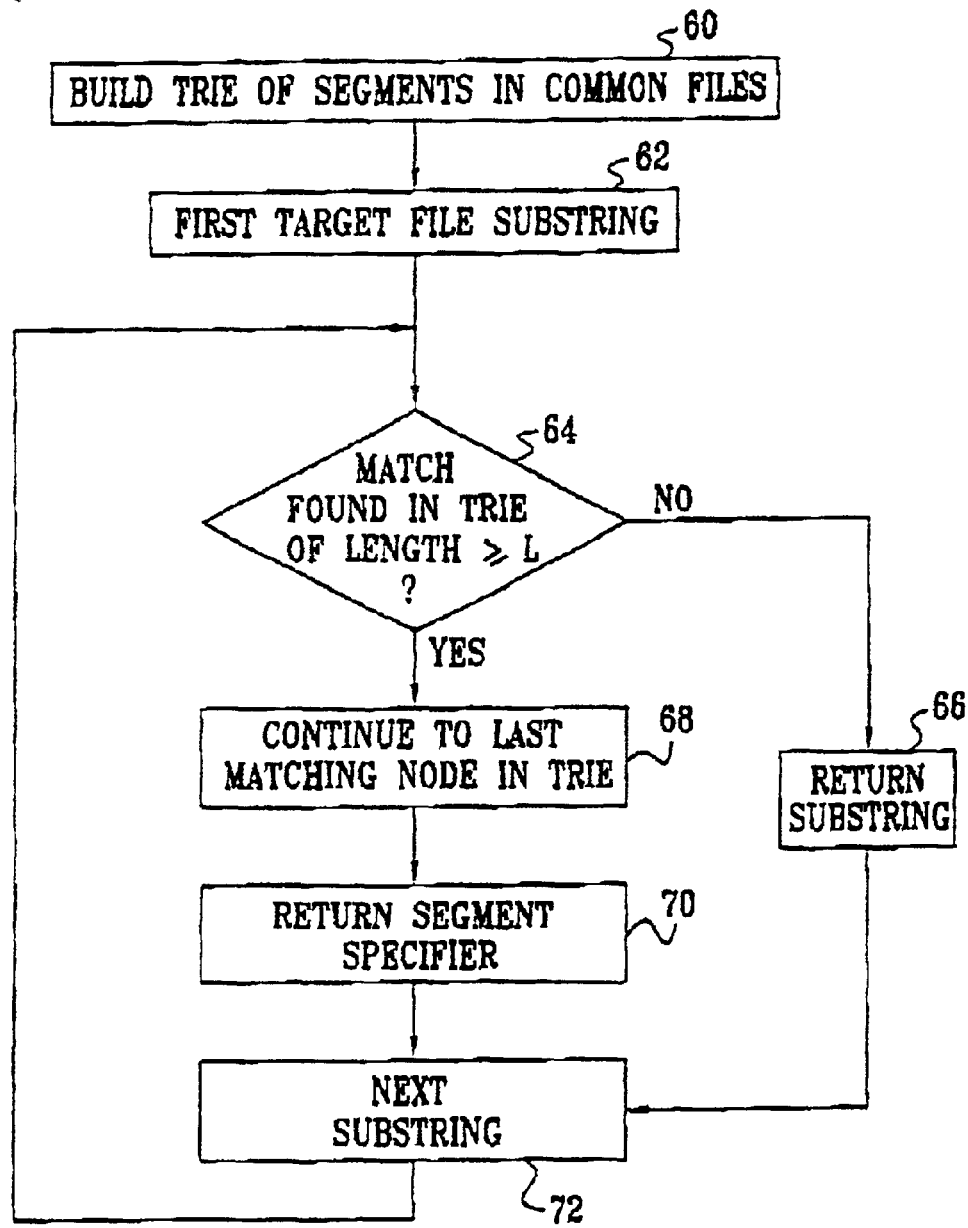
FIGS. 3 and 4 are flow charts that schematically illustrate details of the method of FIG. 2, in accordance with a preferred embodiments of the present invention.

FIG. 3 is a flow chart that schematically illustrates a method for matching substrings in target file 40 to segments in common files 42, in accordance with a preferred embodiment of the present invention. This method corresponds to steps 44 and 46 in the method of FIG. 2. To facilitate the substring matching, processor 22 preferably prepares in advance, for each set of reference files, a trie, at a trie building step 60. A trie is a type of tree, known in the art, that is used to encode all of the segments in all of the files in the set. The edges of the trie are labeled by characters. Distinct edges leaving the same node are labeled by distinct characters. Thus, going along a path down from the root, characters labeling the edges along the path make up a string, with different paths reading different strings. The trie built at step 60 represents all the segments in all the reference files. For each segment, a segment specifier <reference file identifier, offset within the reference file, segment length> is associated with the node reached at the end of the path down from the root that reads the segment. (This segment specifier thus becomes a node specifier.) Because a given segment can appear in more than one reference file, there could be two or more segment specifiers associated with the same node of the trie. The segment length is equal to the length of the path leading from the root to the node.

The trie built at step 60 thus allows many segments to be stored and efficiently and makes it a simple task to match the target file substrings to segments in the reference files. To carry out the matching, starting from the beginning of the target file, at a first substring step 62, the root is left by traversing the edge leaving the root (its "leaving edge") that is labeled by the first character in the target file. The node thus reached is left by traversing its leaving edge that is labeled by the second character in the target file, and so forth, until a node is reached from which there is no leaving edge that is labeled by the current character in the target file. Thus, the first substring is determined.

The second substring starts with the character that follows the last character of the first substring in the target file. The server reads it while traversing the trie, starting from the root once again. The root is left by traversing its leaving edge that is labeled by the first character in the second substring, the node thus reached is left by traversing its leaving edge that is labeled by the second character in the second substring of the target file, and so forth.

For each such substring, the server continues to append successive characters to the substring from the target file and to traverse the corresponding branches of the trie, up to the last node reached by an edge that matches the substring, at a matching step 68. This node thus corresponds to the longest segment in the set of reference files that can match the current substring. When large portions of reference files, such as program or help files, are reused in the target file, as commonly occurs, the longest segment can be hundreds or even thousands of characters. Preferably, a threshold matching length, L, typically equal to a few bytes, is predetermined. At a match evaluation step 64, the length of the match found is evaluated. If it reaches L, the triple or triples specifying this last node-are appended to the list of triples, at a segment specifier return step 70.

On the other hand, if a given substring in the target file reaches a "dead end" in the trie before L nodes have been traversed, it will be inefficient to attempt to code this substring as a triple. Instead, as mentioned above, the substring itself is preferably included in the list of triples at the appropriate place, at a substring return step 66. Most preferably, the short substring is padded with additional, successive characters from the target file, up to length L. An extra leading bit is added to each entry in the list, to indicate whether it is a triple or a short substring, in order to enable efficient coding and decoding of the list.

Following step 66 or 70, the process of coding continues from the next character in the target file after the last coded substring, at a next substring step 72, until the entire target file has been coded.

Figure 4:
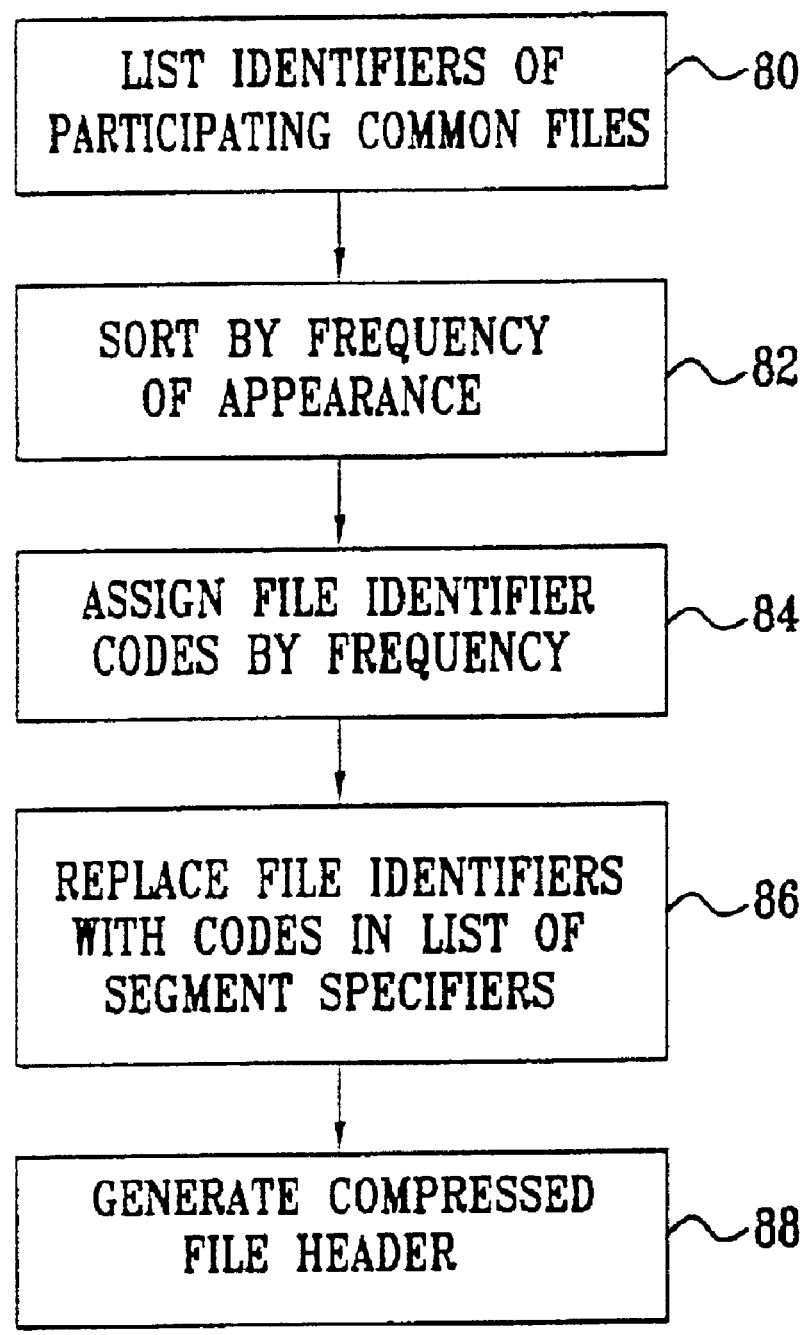

FIG. 4 is a flow chart that schematically illustrates details of list compression step 48, in accordance with a preferred embodiment of the present invention. The method of FIG. 4 is based on the realization that typically, even when the total set of reference files is large, a given target file will draw mainly on a small subset of the reference files. By efficient coding of the reference file identifiers in the list of triples, it is thus possible to reduce substantially the final size of compressed file 50.

At an identifier listing step 80, processor 22 extracts the file identifiers from all of the triples in the list. A count is maintained of the number of occurrences of each of the reference files in the list, including occurrences in triples which appear in sets of multiple triples associated with one segment of the file. Multiplicity of triples for any given segment of the file is then resolved iteratively. At each iteration, the file with the next highest count is picked, at a sorting step 82. Then, for any segment for which a unique triple is not yet defined, and for which the set of associated triples includes a triple whose file component is the file that is currently picked, that triple becomes the unique triple for that segment. The counts of the rest of the reference files, occurring in the other triples associated with that segment, are decremented by one. This "greedy" procedure aims at yielding a small number of reference files, with a relative occurrence frequency of low entropy, which lends itself to good compression using methods of Huffman coding as described below.

A short code, preferably a binary string, is assigned to each file identifier, at a code assignment step 84. Preferably, the short codes are of variable length, and the shortest available codes are assigned to the most frequently-occurring reference files, most preferably using methods of Huffman coding. Huffman codes and related coding methods are described, for example, by Cover and Thomas in *Elements of Information Theory* (Wiley & Sons, New York, 1991), pages 90–101, which is incorporated herein by reference.

The file identifiers in the list of triples are replaced by the corresponding short codes, at an identifier replacement step 86. At a header generation step 88, an index is assembled of all of the reference files used in the final, compressed list of triples, together with the short code assigned to each file identifier. This index is attached as a header to compressed file 50. Preferably, the header also includes other information, such as the name and length of the compressed file and a unique compressed file identifier that is assigned to it. This latter identifier is useful particularly in defining the client platform, or the set of common files 42, over which target file 40 is compressed. Alternatively or additionally, the identifier may indicate that a given file was compressed using internal pointers, as is known in the art, without reference to a set of external common files. Further alternatively or additionally, a given file may be compressed by replacing some of the substrings in the file with external pointers (specifiers) to segments from reference files, while other substrings are replaced with internal pointers.

Figure 5:
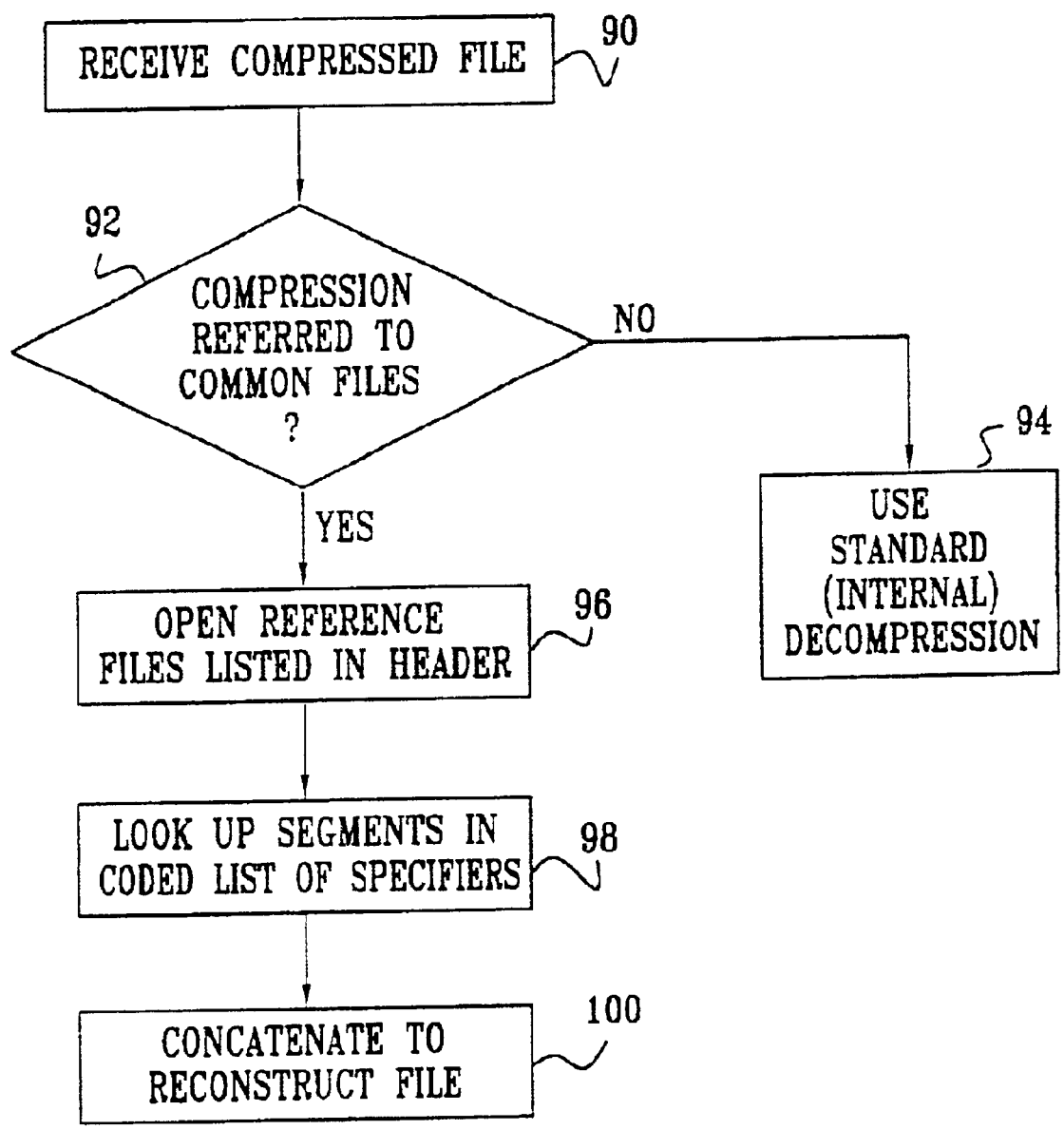
FIG. 5 is a flow chart that schematically illustrates a method for decompressing a compressed file, in accordance with a preferred embodiment of the present invention.

FIG. 5 is a flow chart that schematically illustrates a method for decompressing file 50, in accordance with a preferred embodiment of the present invention. At a file reception step 90, decompression processor 28 receives the compressed file from the server. At a compression checking step 92, processor 28 examines the header of the compressed file to determine the set of common files 42 on which the compression is based. If, as noted above, the header indicates that no external reference files were used, processor 28 decompresses file 50 using the appropriate, standard decompression method, at an internal decompression step 94.

Assuming that the file header does include the list of reference files used in generating the compressed file, processor 28 opens the listed reference files on its own disk 30, at a file opening step 96. The processor then iterates through the compressed list of triples. For each triple in turn, the processor looks up the short code to identify the appropriate reference file, at a segment lookup step 98. It then goes to the location in the file specified by the offset in the triple, and reads out a segment of the specified length. The successive segments thus read out are appended one to another, at a concatenation step 100, along with any uncoded substrings appearing in the list. This procedure, which requires little computing power and progresses quickly, continues until the entire target file 40 has been reconstructed.

Although preferred embodiments are described hereinabove with particular reference to transmission of files from a server to a client, it will be appreciated that the methods described herein can be used in substantially any context of computer data communication and/or storage. Furthermore, although these embodiments refer to target file 40 and common files 42, or reference files, it will be understood that the principles of the present invention are equally applicable to compression of other bodies of data. In other words, the terms "target file," "common files" and "reference files" as used herein should be taken to refer more generally to substantially any bodies of computer-readable data that contain strings of symbols that are amenable to compression.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for data communications, comprising:
   identifying at a sending computer a set of reference files that is stored by a receiving computer;
   matching one or more substrings in a target file to respective segments located in at least one respective reference file within the set of reference files;
   compressing the target file by replacing the one or more substrings with segment specifiers that identify the respective segments and the respective reference file in which each of the respective segments is located; and
   transmitting the compressed file from the sending computer to the receiving computer, whereby the receiving computer decompresses the file using the set of reference files.

2. A method according to claim 1, wherein at least one of the reference files is associated with an operating platform of the receiving computer.

3. A method according to claim 1, wherein at least one of the reference files comprises at least one of a program file and a help file used by the receiving computer.

4. A method according to claim 1, wherein at least one of the reference files is associated with a program run by the receiving computer but not by the sending computer.

5. A method according to claim 1, wherein identifying the set of reference files comprises receiving an identification of the reference files from the receiving computer via a communication link, and wherein transmitting the compressed file comprises choosing the compressed file to transmit responsive to the received identification.

6. A method according to claim 1, wherein identifying the set of reference files comprises recalling a copy of the reference files stored by the sending computer, and wherein matching the one or more substrings comprises finding segments that match the substrings at the sending computer using the recalled copy of the reference files.

7. A method according to claim 1, wherein identifying the set of reference files comprises identifying first and second sets of reference files stored respectively by first and second receiving computers, and wherein matching and replacing the one or more substrings comprises associating first and second pluralities of the substrings with respective matching segments in the first and second sets of reference files, respectively, and replacing the substrings with first and second sets of the specifiers accordingly to generate first and second compressed files, and wherein transmitting the compressed file comprises transmitting the first compressed file to the first receiving computer, and the second compressed file to the second receiving computer.

8. A method according to claim 7, wherein compressing the target file comprises storing the first and second compressed files at the sending computer, and wherein transmitting the first and second compressed files comprises recalling the stored, compressed files for transmission thereof.

9. A method according to claim 1, wherein the target file comprises a first target file, and wherein compressing the target file comprises compressing the first target file and inserting an identification of the respective reference file in which each of the respective segments is located in a header of the compressed file, and comprising compressing a second target file by replacing substrings of the second target file with internal pointers to earlier occurrences of the substrings in the second target file, wherein the header of the compressed file includes a field used to indicate that the second target file was compressed using the internal pointers.

10. A server for data communications, comprising a compressed file processor, which is adapted to receive an identification of a set of reference files that is stored by a receiving computer and to transmit to the receiving computer a compressed file generated by matching one or more substrings in a target file to respective segments located in at least one respective reference file within the set of reference files and by replacing the one or more substrings with segment specifiers that identify the respective segments and the respective reference file in which each of the respective segments is located, whereby the receiving computer decompresses the file using the set of reference files.

11. A method according to claim 10, wherein at least one of the reference files is associated with an operating platform of the receiving computer.

12. A method according to claim 10, wherein at least one of the reference files comprises at least one of a program file and a help file used by the receiving computer.

13. A method according to claim 10, wherein at least one of the reference files is associated with a program run by the receiving computer but not by the server.

14. A server according to claim 10, wherein the processor is adapted to receive an identification of the reference files from the receiving computer via a communication link, and to choose the compressed file to transmit responsive to the received identification.

15. A server according to claim 10, and comprising a storage device, which is adapted to store a copy of the set of reference files, wherein the processor is adapted to recall the reference files from the storage device and to generate the compressed file using the recalled files.

16. A server according to claim 10, wherein the set of reference files comprises first and second sets of reference files stored respectively by first and second receiving computers, and wherein the processor is adapted to transmit to the first receiving computer a first compressed version of the target file, generated using the first set of reference files, and to transmit to the second receiving computer a second compressed version of the target file, generated using the second set of reference files.

17. A server according to claim 16, and comprising a storage device adapted to store the first and second compressed versions, wherein the processor is adapted to recall the stored, compressed versions for transmission thereof.

18. A computer software product for data communications, the product comprising a computer-readable medium in which program instructions are stored, which instructions, when read by a sending computer, cause the sending computer to receive an identification of a set of reference files that is stored by a receiving computer and to transmit to the receiving computer a compressed file generated by matching one or more substrings in a target file to respective segments located in at least one respective reference file within the set of reference files and by replacing the one or more substrings with segment specifiers that identify the respective segments and the respective reference file in which each of the respective segments is located, whereby the receiving computer decompresses the file using the set of reference files.

* * * * *